United States Patent [19]

Martens

[11] Patent Number: 5,175,072
[45] Date of Patent: Dec. 29, 1992

[54] FLEXOGRAPHIC PRINTING PLATE PROCESS

[75] Inventor: John A. Martens, St. Paul, Minn.

[73] Assignee: Minnesota Mining and Manufacturing Company, St. Paul, Minn.

[21] Appl. No.: 558,301

[22] Filed: Jul. 26, 1990

[51] Int. Cl.⁵ .................... G03F 7/34; G03F 7/027
[52] U.S. Cl. .................... 430/254; 430/253; 430/296; 430/306; 430/309; 430/325; 430/330
[58] Field of Search ............ 430/306, 309, 330, 325, 430/200, 253, 254, 296

[56] References Cited

U.S. PATENT DOCUMENTS

| | | | |
|---|---|---|---|
| 3,060,023 | 10/1962 | Burg et al. | 430/254 |
| 3,060,024 | 10/1962 | Burg et al. | 96/28 |
| 3,264,103 | 8/1966 | Cohen et al. | 430/306 |
| 3,353,955 | 11/1967 | Sheldon | 96/28 |
| 3,525,615 | 8/1970 | Chambers | 96/28 |
| 3,591,377 | 7/1971 | Alsup | 96/35.1 |
| 3,607,264 | 9/1971 | Celeste et al. | 96/28 |
| 3,627,529 | 12/1971 | Frank et al. | 96/33 |
| 3,770,438 | 11/1973 | Celeste | 96/67 |
| 4,210,711 | 7/1980 | Kitajima et al. | 430/253 |
| 4,369,246 | 1/1983 | Chen et al. | 430/306 |
| 4,400,459 | 8/1983 | Gruetzmacher | 430/306 |
| 4,423,135 | 12/1983 | Chen et al. | 430/271 |
| 4,452,879 | 6/1984 | Fickes et al. | 430/306 |
| 4,578,504 | 3/1986 | Hammar | 560/112 |
| 4,590,144 | 5/1986 | Schornick et al. | 430/273 |
| 4,638,040 | 1/1987 | Hammar | 526/245 |
| 4,749,617 | 6/1988 | Canty | 428/332 |
| 4,786,657 | 11/1988 | Hammar et al. | 522/90 |
| 5,015,556 | 5/1991 | Martens | 430/306 |
| 5,055,375 | 10/1991 | Matsuo et al. | 430/253 |

FOREIGN PATENT DOCUMENTS 0261910  3/1988  European Pat. Off. .

Primary Examiner—Marion E. McCamish
Assistant Examiner—Janis L. Dote
Attorney, Agent, or Firm—Gary L. Griswold; Walter N. Kirn; Mark A. Litman

[57] ABSTRACT

Negative-acting photohardenable compositions are useful in flexographic printing plate manufacture without the use of solvent development. Unhardened composition is softened and absorbed by an absorbent sheet. Absorbed composition can be removed from the sheet and recycled.

6 Claims, No Drawings

FLEXOGRAPHIC PRINTING PLATE PROCESS

BACKGROUND OF THE INVENTION 1. Field of the Invention

The present invention relates to a method of using radiation curable polyurethane elastomeric compositions and a method of making flexographic printing plates produced with those compositions. The plates are developable in a solventless absorption processing method. This invention describes compositions which are resistant to swelling when immersed in water or solvent based flexographic inks, which resistance property is critical to the use of these compositions in the form of flexographic printing plates. 2. Background of the Art Flexography is a term that broadly applies to a printing format using a flexible substrate bearing an elastomeric or rubbery relief printing surface.

The first flexographic printing plates were produced from natural or synthetic rubber compositions which were cured chemically under heat and pressure in a mold utilizing conventional rubber curatives such as mercapto compounds (*Flexography: Principles and Practices*, 3rd Edition, Flexographic Technical Association, p 158-162). More recently, photopolymer elastomeric compositions (elastomer containing compositions curable upon exposure to actinic radiation) useful to produce relief printing plates have been described. For example, U.S. Pat. Nos. 4,369,246 and 4,423,135 describe solvent-insoluble, elastomeric printing relief plates which are formed by applying to a sheet support a layer of a photosensitive composition comprising (1) at least 30 weight % of a solvent-soluble co-polymer containing at least 2 thermoplastic, non-elastomeric blocks of glass transition temperature above 25° C. and average molecular weight 2000-100000 and between these blocks, an elastomeric block copolymer having a glass transition temperature below 10° C. and average molecular weight 25,000-1,000,000; (2) at least 1 weight % of an addition polymerizable compound containing at least one terminal ethylenic group; and (3) a polymerization initiator at a dry thickness of 0.005-0.250 inch. A flexible polymer film and flexible cover sheet are laminated to the composition layer. The plate is formed by stripping off the cover sheet, imagewise exposing the layer to actinic radiation through the film, and removing the film and unexposed areas of the layer by solvent washing. Solvents such as perchloroethylene (1,1,1 trichloroethylene) either alone or in combination with alcohols such as n-butanol are utlized. Likewise, EP Pat. 261,910 describes a further example of a water-developable flexographic relief printing plate comprised of (1) monomers and polymers of acrylic acid esters and (2) a ketone photopolymerizing/photocrosslinking agent, which are coated on a support sheet. Following imagewise exposure (to promote crosslinking), the relief areas of the plate are produced by washout with an aqueous developer. After washout, all of the flexographic platemaking compositions and methods described heretofore require drying of the plate for extended periods (1 to 24 hours) to remove entrained developer solution and then are subjected to a post-finishing process (chemical or photochemical) to reduce surface tack of the plate before use on a printing press. In addition to the extended time periods required to produce flexographic printing plates by the aforementioned technologies (by reason of the multiplicity of processing steps required in series), these technologies also produce potentially toxic by-product wastes in the development procedure. In the case of the solvent-washout technology, organic solvent waste is generated which is potentially toxic in the form of both the solvent and the addition polymerizable compound 2) which contains at least one terminal ethylenic group. Likewise, the aqueous washout plate technologies also produce a contaminated waste water by-product stream which may contain similar addition polymerizable compounds that may have cytotoxic effects.

Many different types of monomers and cross-linkable resins are known in the polymer art, their properties can be adjusted as taught in the art to provide rigidity, flexibility, or other properties. Particularly good materials related to the compositions of the present invention are shown in U.S. Pat. Nos. 4,578,504; 4,638,040; and 4,786,657.

Various types of curable polyurethane elastomeric compositions are known. The term "elastomer" or "elastomeric" is used to refer to rubbers or polymers that have resiliency properties similar to those of rubber. In particular, the term elastomer reflects the property of the material that it can undergo a substantial elongation and then return to its original dimensions upon release of the stress elongating the elastomer. In all cases an elastomer must be able to undergo at least 10% elongation (at a thickness of 0.5 mm) and return to its original dimensions after being held at that elongation for 2 seconds and after being allowed 1 minute relaxation time. More typically an elastomer can undergo 25% elongation without exceeding its elastic limit. In some cases elastomers can undergo elongation to as much as 300% or more of its original dimensions without tearing or exceeding the elastic limit of the composition. Elastomers are typically defined to reflect this elasticity as in ASTM Designation D883-866 as a macromolecular material that at room temperature returns rapidly to approximately its initial dimensions and shape after substantial deformation by a weak stress and release of the stress. ASTM Designation D412-87 can be an appropriate procedure for testing rubber properties in tension to evaluate elastomeric properties. Generally, such compositions include relatively high molecular weight compounds which, upon curing, form an integrated network or structure. The curing may be by a variety of means, including: through the use of chemical curing agents, catalysts, and/or irradiation. The final physical properties of the cured material are a function of a variety of factors, most notably: number and weight average polymer molecular weights; the melting or softening point of the reinforcing domains (hard segment) of the elastomer (which, for example, can be determined according to ASTM Designation D1238-86); the percent by weight of the elastomer composition which comprises the hard segment domains; the structure of the toughening or soft segment (low Tg) portion of the elastomer composition; the cross-link density (average molecular weight between crosslinks); and the nature and levels of additives or adjuvants, etc. The term "cured", as used herein, means cross-linked or chemically transformed to a thermoset (non-melting) or relatively insoluble condition.

BRIEF DESCRIPTION OF THE INVENTION

The present invention relates to a process for producing a flexographic printing plate by providing a radiation hardenable composition (radiation polymerizable, radiation curable, or radiation cross-linkable) as a layer on a flexible substrate, imagewise irradiating said composition to harden the composition in irradiated areas, contacting said imagewise irradiated layer with an absorbent layer which can absorb unirradiated composition when it has been heated between 40° and 200° C., heating said composition layer so that it is at a temperature between 40° and 200° C. while in contact with said absorbent layer, said temperature being sufficiently high to enable said composition in unirradiated areas to flow into said absorbent layer, allowing at least 75% of said composition in unirradiated areas in contact with said absorbent layer to be absorbed by said absorbent layer, and removing said absorbent layer and said at least 75% of composition from unirradiated areas from said flexible substrate. The process can also utilize a predevelopment step that can improve the anchoring of the irradiated composition to the flexible substrate by first developing a 'floor' on the substrate. The imageable composition on a substrate which transmits ionizing radiation (e.g., e-beams, short wavelength U.V. radiation, etc.) is first generally exposed through the substrate to generate a floor of polymerized composition. This floor is not removed from the substrate during development and is not to be considered in the determination of the at least 75% of composition removed from non-irradiated areas. It is desirable that the elevated temperatures used to cause the unirradiated composition to flow (reduce its viscosity, or exceed its softening temperature, e.g., see ASTM Designation D 1238-86) into and be absorbed by the absorbent layer (without the necessity of reduced air pressure behind the layer) should not distort the flexible substrate or the hardened composition by more than 2% in any surface dimension. The actual temperatures will vary with the specific substrate and composition used. Preferably at least 80% of the unirradiated composition is removed from the areas heated in contact with the absorbent layer. More preferably at least 90 or at least 95% is removed. The hardening or curing step of the process (by irradiation) can also act to increase the adhesion of the composition to the substrate. This can be by direct adhesion of the curing composition to the substrate (either chemical adhesion by reaction or ophysical adherence to surface structure on the flexible layer) or by adhesion (usually by chemical reaction) to a primer layer on the substrate. The primer layer may be photosensitive or photoinsensitive to aid in this adherence effect.

The present invention can be practiced on some commercially available flexographic printing plates (e.g., DuPont PLS) but is particularly useful with specially designed low temperature melting, high melt index, radiation curable, elastomeric polyurethane compositons useful in producing flexographic printing plates for use in graphic arts printing applications. The cured elastomer compositions have a further property of a reduced tendancy to swell or increase in volume when immersed in flexographic inks, such as water based inks utilized in the flexographic printing process. This low swell property is critical to the ultimate printing quality which can be achieved with the printing plate since swelling causes the relief image to enlarge. A 2% dot for instance, due to inordinate swelling of the plate in the printing ink may actually print as a 15 or 20% dot on the printed page due to this undesirable phenomenon. The press life or wear life of the plate on press (the number of impressions until failure occurs) may also be greatly reduced by swelling which may result in a loss in physical strength of the cured elastomer compositon.

An additional feature of the radiation curable polyurethane elastomers of this invention is that they will cure or crosslink when exposed to actinic radiation without need of additional vinyl containing monomeric additives, such as monomers containing more than one vinyl group per molecule. This feature reduces some of the potential for contamination of the environment of the earth (soil, water or air) with potentially cytotoxic agents. Furthermore, the safety of the workers involved in producing and using flexographic printing plates utilizing this technology is enhanced through elimination of human exposure to some of these same cytotoxic agents.

Further features of the radiation curable polyurethane elastomers of this invention are their relatively low melting temperatures and high melt indices (low melt viscosities). The present invention particularly concerns flexographic printing plates produced from novel radiation curable polyurethane elastomeric compositions, which printing plates are developed utilizing a novel solventless absorption processing method. The absorption flexographic plate processing method eliminates the need for liquid developers (water or solvent) of any kind. This novel plate making method results in a substantial reduction of plate making steps, plate making process time, and the elimination of potentially toxic by-product waste streams in plate making. While it is foreseen that the radiation curable elastomeric polyurethane compositions according to the present invention may be used for other purposes, and in other industries, they are particularly well suited for application to the flexographic printing industry.

The storage stability of the radiation curable elastomer coated sheet material prior to curing is also important. Specifically, resistance of the elastomer layer to cold flow during storage is desirable. If the elastomer layer undergoes too much cold flow, the resulting printing plate may lose its utility due to changes in plate thickness uniformity which could occur during such flow. The radiation curable polyurethane elastomers of this invention are noted by a resistance and even a high resistance to cold flow prior to irradiation induced crosslinking or curing.

Generally, a flexographic printing-plate consists of a curable elastomeric polymer layer which is planar contiguous to a flexible support layer or sheet which may be, for example, polymeric (film base) or metallic (metal base). Following cure of portions of the elastomeric layer (by imagewise exposure to actinic radiation), the uncured portions are removed to reveal a relief structure (hills) which becomes the printing surface of the plate in the flexographic printing process. The relief structure (in the cured areas) is bound to the support layer by physical and/or chemical action so as to remain in place during the printing process through repeat impressions. The exposed surface of the cured elastomer layer becomes the ink receptive surface which both receives ink from the inking roll (anilox) and transfers it to the substrate to be printed during the printing process. The flexographic printing process is a 'direct' printing process because the printing plate and its temporarily bound ink layer are in direct contact with the substrate (e.g., paper or film) being printed. A variety of substances may be used as the support layer beneath the cured elastomeric layer of a flexographic printing plate. Flexible substrates of synthetic polymeric resins such as polyester, polycarbonate, or polyimide films may be used or more rigid substrates (which are still flexible) such as steel or aluminum coil stocks may be selected.

DESCRIPTION OF THE INVENTION

The process of the present invention for producing a flexographic printing plate comprises providing a relief imageable element comprising a flexible substrate which can transmit ionizing radiation, said substrate having on one surface thereof a radiation hardenable composition in a thickness of at least 0.3 mm, imagewise irradiating said composition to harden the composition in irradiated areas, contacting said imagewise irradiated layer with an absorbent layer which can absorb unirradiated composition when it has been heated between 40° C. and 200° C., heating said composition layer to a temperature between 40° C. and 200° C. while it is in contact with said absorbent layer, said temperature being sufficiently high so as to enable said composition in unirradiated areas to be absorbed by said absorbent layer (usually by flowing into said absorbent layer), allowing at least 75% by weight of said composition (which is unirradiated) in unirradiated areas to be absorbed by said absorbent layer, and removing said absorbent layer and said at least 75% by weight of composition from said flexible substrate, the process further comprising the step of irradiating said composition layer through the substrate with ionizing radiation to harden some but less than all of said composition layer and thereby form a hardened zone between said flexible substrate and unhardened composition before said at least 5% of said composition is allowed to be absorbed by said absorbent layer.

The step of irradiating the composition from the backside of the element (i.e., through the substrate) is preferably done before the imagewise exposure to radiation to generate the floor or anchor zone before hardening through the depth of the composition layer. The ionizing exposure may be performed after imaging with beneficial effects, but without as great a benefit as exposure prior to imaging.

A novel class of radiation curable polyurethane elastomers are provided which are derived from polymer forming reactions of: (A) at least one diisocyanate (e.g., a diisocyanate or mixture of diisocyanates); (B) a first chain extension agent containing at least 2 free hydrogen containing groups, preferably at least 2 hydroxyl groups and at least one ethylenically unsaturated group per molecule; (C) an optional ingredient comprising a chain extension agent different from said first chain extending agent and containing at least 2 free hydrogen containing groups, preferably at least 2 hydroxyl groups and up to 11 carbon atoms; (D) a polyol having a molecular weight of at least 500 grams/mole which contains at least 2 free hydrogen containing groups such as at least 2 hydroxyl groups per molecule (said polyol preferably but not essentially having a solubility parameter less about 9.0), which resulting polyurethane elastomer has a number average molecular weight of at least 10,000 grams/mole, a melt transition temperature of less than about 180° C. and a melt index at 180° C. of at least 0.5 grams/minute (according to ASTM No. D 1238-70) with an 11,000 gram load and a 0.38 inch bore. The elastomer of the present invention may also be generally described as a radiation curable polyurethane elastomer having ethylenically unsaturated groups available for addition polymerization, said elastomer comprising the reaction product of (A) 10–50% by weight of at least one diisocyanate.
(B) 0.5–20% by weight of a first chain extending agent having at least two free hydrogen groups capable of polymerizing with isocyanate groups, and said first chain extending agent having at least one ethylenically unsaturated addition polymerizable group per molecule, and
(C) 10–70% by weight of an organic polyol having a molecular weight of at least 500 and containing at least two free hydrogen containing groups capable of polymerizing with isocyanate groups per molecule, said polyurethane elastomer having a number average molecular weight of at least 10,000 grams/mole, a melt transition temperature of less than 180° C. and a melt index at 180° C. of at least 0.5 grams/minute. These elastomers may optionally contain 0.5 to 20% by weight (preferably 0.75 to 12%) of a second chain extending agent different from said first chain extending agent and having at least two free hydrogen groups capable of polymerizing with isocyanate groups. The radiation curable polyurethane elastomeric compositions of the present invention are characterized as belonging to a general class of polymers known as segmented copolymers or multiphase polymers, which general class or classes have been well described in many references (e.g., *Multiphase Polymers*, Advances in Chemistry Series, Vol. 176, Stuart L. Cooper, and Gerald M. Estes, editors, 1978, pp. 1–83). The elastomeric properties of this class of polymers results from phase segregation or phase separation between so called "hard" segment domains and "soft" segment domains. The "hard" segment domains, which possess a melt transition temperature or temperatures above the use temperature of the elastomer (when used, for example, as a printing plate, the use temperature would be between about 15° C.–40° C.), act as reinforcing domains. The "soft" segment domains, which possess a glass transition temperature below the use temperature of the elastomer, act as a toughening phase which is able to dissipate energy by a process known as viscous energy dissipation. The two phases of the elastomer are thought to exist as separate phases within the elastomer by virtue of thermodynamic incompatibility. The elastomers of the present invention are preferably able to display a percent swell of less than 2%, more preferably less than 1% and most preferably less than 0.5% in water. This property is readily measured by immersing the elastomer (e.g., 1 mm thick) in deionized water at 20° C. for twenty-four hours. If the thickness has increased less than 2%, there is less than 2% swell.

In the urethane elastomer having both hard segments formed by the reaction of components A), B), and/or C) and soft segments formed by the reaction of components A) and C), the soft segments comprise 20 to 70% by weight of the elastomer.

The novel radiation curable polyurethane elastomers which are produced from the above described polymer forming reactions are coated in layer form on a support sheet to provide an imageable photopolymer elastomer layered product. Following imagewise irradiation induced curing of the elastomer layer, and removal of the uncured elastomer portion of the elastomer layer, a flexographic printing plate is provided which is particularly useful in printing when combined with water based flexographic printing inks. A particularly important feature of the radiation curable elastomeric polyurethanes of the present invention is that the radiation curable feature derives from incorporation of the radiation curable functional groups into the polymer chains during the polymer forming reactions. These radiation curable groups are retained in the uncured state during the formation of the polymer chains, however, until activated by exposure to actinic radiation as will occur during the flexographic printing plate making process. The radiation curable functional groups are incorporated into the polymer chains by chain extending species (B).

The chain extension agents (B) useable according to the present invention include therein a reactive unsaturated moiety, preferably particularly sensitive to, and available for reaction upon curing via free radical reactions to generate cross-linking. Preferred unsaturation moities in chain extension agents according to the present invention are carbon-carbon double bonds (olefinic or ethylenically unsaturated bonds), and particularly preferred moieties are activated carbon-carbon double bonds. Generally, "activated" carbon-carbon double bonds in a class of chain extension agents utilizable according to the present invention include: double bonds activated through conjugation with a carbonyl group; those double bonds activated due to substitution by various other functional groups tending to stabilize free-radical formation and hence activate the double bond toward free radical reactions. In preferred chain extension agents according to the present invention, the "activated" double bond is oriented such that, when the chain extension agent is incorporated into the polymer backbone, i.e., between urethane or carbamate units, the activated double bond is in a portion of the polymer molecule remote from, or pendant to, the polymer backbone. That is, the activated double bond does not itself form part of the polymer backbone, but rather it is located on the polymer chain in a group pendant therefrom. A general chemical characteristic of chain extension agents according to the present invention is that they are di-hydroxy substituted organic compounds, which contain at least one activated double bond therein. Preferably no more than two hydroxy groups (that is, preferably less than an average of 2.10 and more preferably less than an average of 2.05 hydroxy equivalents per compound) are included in the compound, so that the chain extension agents do not generate substantial networking and cross-linking, during initial reaction with a polyurethane prepolymer to form the extended polyurethane polymer composition (uncured). As previously noted, these chain extending species may be di-free hydrogen containing compounds, which are inclusive of the di-hydroxy compounds. Useful free hydrogen containing compounds would have such groups as —SH, —NH,, or —NHR (where R is an alkyl group or phenyl group) in place of one or more of the hydroxy groups. Hydroxy groups are especially preferred because of the resultant melting temperatures and melt indexes in the urethane product. The other free hydrogen reactant groups can produce polyurethanes having too high of a melt transition temperature or too low of a melt index. It is desirable to produce these polyurethanes with melt transition temperatures less than 155° C. (preferably less than 150° C.) and a melt index greater than 5 grams/10 minutes in the temperature range of 100° C. to 180° C. when measured according to ASTM No. D-1238-70 (preferably between 100° C. and 140° C.). Preferably, at least one and, most preferably, both hydroxy groups of the chain extension agent (B) are primary, so that reaction with isocyanate moieties to generate chain extension of growing polymer molecules will be relatively rapid, so as to compete effectively in reaction with other classes of chain extension agents, described below, utilizable to provide for other advantageous chemical and physical characteristics in the elastomeric composition. Preferred chain extension agents are those described in U.S. Pat. No. 4,578,504 and U.S. Pat. No. 4,638,040 having the structural formula wherein —X and —Y are hydroxyl and hydrogen respectively (1- or 2- glycerol acrylate or methacrylate) and those described in U.S. patent application Ser. No. 184,834 filed Apr. 22, 1988, in the name of J. A. Martens, et al. such as N,N-bis (2-hydroxyethyl), N'-(methacryloxyethyl) urea:

$$CH_2=C(CH_3)C(O)OCH_2CH_2NHC(O)N(CH_2CH_2OH)_2$$

In preferred compositions of the present invention, an activated double bond-containing chain extension agent is incorporated into a polymer to be cured such that, on the average, there is about 1 pendant, activated, unsaturation site provided every 2,000 to 10,000 molecular weight units in the polymer. For use in preferred applications such as flexographic printing plates, the number average molecular weight of chains in the polymeric elastomer (before curing) should be in the range of about 20,000 to 50,000, corresponding to weight average molecular weights in the range of about 35,000 to 95,000. In addition, the melt indices of the resulting molten radiation crosslinkable elastomeric compositions when measured according to ASTM No. D 1238-70 should be in the range of 0.5 grams/minute to 10.0 grams/minute in the temperature range from 100° to 180° C.

To show how the percentage of double bond contributing reagent added to the polymer affects the double bond equivalent weight of the polymer (the average molecular weight divided by the average number of double bonds pendant from the polymer), consider a polymer having one percent (1%) by weight of a double bond providing reagent in the reaction mixture with a polymer whose molecular weight provides a double bond equivalent weight of 16,000 in the product. By doubling (to 2%) the weight of the double bond providing reagent, the double bond equivalent weight is halved to 8,000. Using 2-glycerol methacrylate (GMA) as an example, in the same molecular weight polymer, the following relationship would exist for GMA versus equivalent weight (EW):

| % GMA | EW |
|---|---|
| 1% | 16,000 |
| 2% | 8,000 |
| 3% | 5,333 |
| 4% | 4,000 |
| 5% | 3,200 |

The polyol(D) of the reaction mixture, possessing a solubility parameter of less than about 9.0, is a hydrophobic polyol having as such a resistance to the imbibing of water and water/alcohol mixtures, and a hydroxyl equivalent weight of at least 250 gr./equivalent. Preferable polyols which can be employed herein are those polyether polyols which have an average hydroxyl functionality of from about 2 to 3 and an average hydroxyl equvalent of from about 250 to about 5000, preferably from about 500 to 3000, including mixtures of these polyols. Particularly suitable polyether polyols which can be employed include those which are prepared by reacting an alkylene oxide or halogen substituted alkylene oxide or mixtures thereof with an active hydrogen containing initiator compound. Suitable such oxides include, for example ethylene oxide, propylene oxide, 1,2-butylene oxide, 2,3-butylene oxide, epichlorohydrin, epibromohydrin, mixtures thereof and the like. When ethylene oxide is employed, it should not constitute more than 10% by weight of the polyol. Preferred oxides are 1,2-butylene oxide and epichlorohydrin. Such polyols are well known in the art of polyurethane chemistry and are commercially available. The poly 1,2-(butylene oxide) polyols are commercial products of the Dow Chemical Company. The polyepichlorohydrin polyols are described in U.S. Pat. 4,431,845 and are commercial products of the 3M Company.

The organic diisocyanate or diisocyanates (A) are selected from organic aromatic or aliphatic diisocyanates or mixtures thereof. Suitable organic aromatic diisocyanates which can be employed include, for example, any such isocyanate having 2 or more NCO groups per molecule such as for example 2,4-toluenediisocyanate, 2,6-toluenediisocyanate, p,p'-diphenylmethanediisocyanate, p-phenylene diisocyanate, naphthalenediisocyanate, polymethylene polyphenyl isocyanates, 1,3,3,5-tetra methyl-1,6-bis-(isocyanato)hexane (TMXDI), mixtures thereof and the like. Suitable organic aliphatic polyisocyanates include in addition to the hydrogenated derivatives of the above mentioned organic aromatic polyisocyanates, 1,6 hexamethylene diisocyanate, 1,4-cyclohexyl diisocyanate, 1,4-bis-isocyanatomethyl-cyclohexane, isophorone diisocyanate, mixtures thereof and the like. Preferred isocyanates are the cycloaliphatic diisocyanates which o include 4,4'-bis(isocyanato cyclohexyl) methane, 1,4-cyclohexyl diisocyanate, and isophorone diisocyanate.

Suitable chain extension agents (C) which can be employed include hydroxyl-containing aliphatic compounds which contain at least 2 but not more than 3 hydroxyl groups per molecule. Suitable hydroxyl-containing chain extenders include, for example, ethylene glycol, propylene glycol, 1,4 butane diol, diethylene glycol, dipropylene glycol, triethylene glycol, tetraethylene glycol, glycerine, trimethylol propane, low molecular weight ethylene and/or propylene oxide derivatives of glycerine, or trimethylol propane and the like.

The radiation curable elastomer composition may contain, in addition to the above described components, other components or adjuvants such as photoinitiators, colorants, fillers, catalysts, stabilizers and inhibitors, such as may be desired to impart other properties to the curable elastomer layer such as storage stability, visible color, etc. Such adjuvants may be incorporated into the polymer backbone as by reaction or may simply exist as additives to the overall composition not incorporated into the polymer chain.

As is well known in the art, ethylenically unsaturated bonds (like those which can be pendant from the elastomers used in the present invention) can be cured directly with ionizing radiation such as e-beams and other high energy radiation). It is not essential that initiators be present in the composition of the invention, but it is highly desirable. Preferably any of the known classes of photoinitiators, particularly free radical photoinitiators such as the quinones, acetophenones, benzoin ethers, aryl ketones, peroxides, biimidazoles, diaryliodoniums, triarylsulfoniums (and phosphoniums), diazoniums (especially the aromatic diazoniums), etc. may be used in the compositions of the present invention, generally in amounts of from 0.1 to 15% by weight, preferably from 0.3 to 10% by weight, more preferably from 0.5 to 8% by weight of the elastomer. The photoinitiators may be used as mixtures of different initiators and/or in combination with dyes that are well known in the art to sensitize or spectrally sensitize the photoinitiators.

Another desirable aspect of preferred compositions useful in the practice of the present invention is that lower molecular weight polyacryloyl (including methacryloyl) materials are not needed in the composition. Such polyacryloyl materials (di-, tri-, tetra-, penta-, hexyl-acryloyl or methacryloyl) are undesirable for a number of reasons. The present invention has no problem operating completely free of polyacryloyl (which includes methacryloyl) compounds with molecular weights of 1000 or less. From many manufacturing standpoints it is especially desirable to have crosslinkable compositions with less than 2.0% by weight of such polyacryloyl compounds. The present invention preferably has less than 2.0% of such compounds, more preferably less than 1.0%, still more preferably less than 0.5%, and most preferably 0% of polyacryloyl materials with molecular weights less than or equal to 1000.

The radiation curable polyurethane elastomeric compositions of the present invention are preferably produced utilizing melt polymerization techniques. Polymerization in the melt avoids the use of organic solvents and solvent mixtures producing an elastomer product which can be applied directly to the support sheet in molten form without concern for drying ovens which would otherwise be necessary to remove such organic solvents from the elastomeric layer prior to making flexographic printing plates. A preferred method of producing these compositions involves use of a polymer processing melt extrusion device, such as a twin-screw counter rotating extrusion device, as the polymerization reactor (such as disclosed in U.S. Pat. No. 4,843,134). Such an extrusion device provides for temperature control, thorough mixing of reacting species, and control of the pressure profiles down the extruder during processing which affects backmixing of and the resulting residence time distribution of the reactants. Upon completion of the radiation curable elastomer forming reactions in the extruder, the molten, fully reacted, uncured thermoplastic elastomer composition can be applied directly to the support sheet via passage through a film forming extrusion die followed by contacting a moving web of the support materials. The molten uncured elastomer also can be collected as pellets, or in some other solid form (slabs) for later processing into flexographic printing plates using other forms of processing such as conventional single screw melt extrusion processing.

For the purpose of producing a flexographic printing plate having excellent durability (press life), and resistance to delamination of the elastomeric layer from the support layer or sheet, it is generally desirable to enhance the adhesion or bonding strength of the cured elastomer layer to the support sheet utilizing priming agents or adhesion promoting treatments which are applied to the film or metallic support layer prior to application of the radiation curable elastomeric layer. Such treatments are generally done to the surface of the support layer or sheet prior to application of the molten curable elastomeric layer. Treatments such as corona discharge treatments, laser modification as in U.S. Pat. 4,822,451, application of chemical priming agents, or mechanical roughening of the surface are effective in increasing adhesion of the curable elastomeric layer to the support.

Following the completion of fabrication of the radiation curable polyurethane elastomeric composition into a planar contiguous layer in contact with a support sheet (film or metallic base), flexographic printing plates can be produced by imaging and development. This is accomplished by curing the polyurethane elastomeric layer by exposure to actinic radiation, which exposure acts to harden or crosslink the elastomeric layer rendering it more or less unmeltable or insoluble in the irradiated areas. The exposure to actinic radiation can be done in several ways. In a preferred method, th curing is accomplished in two exposure steps. The first exposure, called the backside exposure, is done with actinic radiation being directed toward and through the support layer into the elastomeric layer with the actinic radiation source positioned ajacent to but seperated from the support layer side of the two-layered plate being exposed. This exposure causes a gradation of curing or crosslinking of a portion of the curable elastomeric layer, the curing being most complete nearest the support layer. The time duration of the backside exposure is determined experimentally and is chosen so as to cause a gradient of cure within the radiation-sensitive elastomeric layer. The highest level of cure (crosslinking) of the elastomeric layer occurs nearest the support layer, with the cure levels being reduced as the distance within the elastomeric layer, as measured from the support layer, increases. A so-called gradient cure takes place during this exposure step, the gradient resulting from a fall off or reduction in effective actinic radiation intensity within different levels of the elastomeric layer. This reduction occurs by virtue of at least partial absorption of actinic radiation by the elastomeric layer, as measured within the curable elastomeric layer. Following this brief exposure step (brief as compared to the imagewise exposure step which follows), an imagewise exposure is accomplished utilizing a photographic negative mask which is placed in contact with the elastomer layer and through which actinic radiation is directed. This brief backside exposure is preferably done with ionizing radiation and is not done with such radiation or intensity as would generally activate all free radical photoinitiators within the elastomeric layer. One can readily test the material to determine if there has been crosslinking or differential crosslinking by common testing procedures such as those shown in U.S. Pat. No. 4,576,850 (Gel Swell measurements).

A vacuum frame exposure device is preferred for such imaging (as opposed to the brief) exposure, which is accomplished following thorough exhausting of air from between the elastomer layer and the photographic negative. The exposure to actinic radiation in an imagewise manner is then accomplished, with the exposure of sufficient duration as to render the curable elastomeric layer essentially unmeltable or insoluble under reasonable conditions of flexographic plate use.

In the most preferred method for forming the graded-cure radiation curable elastomeric layer, the radiation curable elastomeric planar contiguous layer is exposed to ionizing radiation from an electron beam source with the accelerated electrons being directed toward and through the support layer into the elastomeric layer with an energy insufficient to penetrate the entire curable elastomeric layer.

Preferably less than 75% of the ionizing radiation would penetrate through a thickness of 50% of the curable elastomeric layer. In this way, the curing, or hardening of the elastomeric layer is only partially effected with the curing being most complete at the interface of the elastomer layer with the support layer or sheet and being incomplete at the outer surface (surface away from the support sheet) of the planar contiguous elastomeric layer. By regulating or otherwise controlling the penetrating power of the electron beam irradiation source, as by controlling the potential energy field through which the accelerating electrons are passed, the pathlength of the electrons through the support sheet and elastomeric layer is controlled. The backside pre-imaging cure process step can provide a continuous, relatively thin layer of cured elastomeric composition strongly bonded to the substrate. This thin cured layer can act as a footing or support surface for later generated image features. Particularly with respect to small details, e.g., 1 or 22 dots, the footing physically strengthens the adherence of the small features or details and reduces their tendency for wear or premature removal from the plate. This increases the detailed printing life of the flexographic plate.

In the preferred method, following electron beam exposure, an imagewise exposure of the radiation curable elastomeric layer is accomplished. This exposure is most preferably accomplished by exposure of the curable elastomeric layer to actinic radiation through a photographic negative mask which is placed in contact with the elastomer layer and through which actinic radiation is directed. A vacuum frame exposure device is preferred for such exposure, which is accomplished following thorough exhausting of air from between the elastomer layer and the photographic negative. The exposure to actinic radiation in an imagewise manner is then accomplished, with the exposure of sufficient duration as to render the curable elastomeric layer essentially unmeltable or insoluble.

Following imagewise exposure to actinic radiation, the development of the relief structure is accomplished by removal of the uncured portions of the elastomer layer. In the preferred method of removal, an absorbant sheet material is utilized in the following manner. The photographic negative mask is removed from the elastomer layer, and replaced with an absorbant sheet material. The absorbant material is selected from non-woven web materials, paper stocks, fibrous woven web materials, open-celled foam materials, porour sheets, or other sheet materials which contain, more or less, a substantial fraction of their included volume as void volume. The uncured elastomer layer is heated by conduction, convection, or other heating methods to a temperature sufficient to effect melting. By maintaining more or less intimate contact of the absorbant sheet material with the molten elastomeric layer (molten in the uncured regions), a transfer of the uncured elastomer from the planar contiguous layer to the absorbant sheet material takes place. While yet in the heated condition, the absorbant sheet material is separated from the cured elastomer layer in contact with the support layer to reveal the relief structure. After cooling to room temperature, the resulting flexographic printing plate can be mounted on a printing plate cylinder and tested on a printing press as to printing capability.

Preferred absorbant sheet materials utilized to remove the uncured portions of the elastomeric layer from the cured portions of said layer are selected from absorbant materials which possess internal strength and tear resistance at temperatures up to, including, and slightly beyond the melting temperature of the uncured radiation curable polyurethane elastomeric composition, and which furthermore possess a high absorbancy for the molten elastomer composition as measured by the grams of elastomer which can be absorbed per milliliter of absorbant material. Preferred absorbant sheet materials, which may be referred to as development receptor sheets, are blown microfiber non-woven web materials produced from high temperature melting polymeric materials such as polypropylene, polyester, nylon or other high temperature melting thermoplastic polymers. The melting or softening temperature of the absorbant sheet material utilized should be higher than the melting or softening temperature of the radiation curable polyurethane elastomer utilized in the planar contiguous layer of the flexographic printing plate being produced. Additional absorbant sheet materials which can be utilized according to the present invention include absorbant stocks produced by various paper making processes. Absorbant materials such as open-celled thermoset foams are also acceptable. Preferred absorbant sheet materials contain a void volume fraction of at least 50% of the included volume of the sheet (as measured in the uncompressed condition). The most preferred absorbant sheet materials are spun-bonded nylon non-woven webs such as CEREX ™ non-woven webs produced by the James River Corporation. Inorganic filament webs, particularly those with porous filaments, may also be used.

In the use of the term absorption in defining the relative physical property between the development receptor sheets and the melted uncured elastomeric composition, no particular limitation on absorptive phenomena is intended. There need not be penetration of the melted composition into the body of fibers, filaments or particles. The absorption into the bulk of the development receptor may be only by surface wetting of the interior bulk. The driving force for the movement of the melted elastomeric composition into the absorptive area of the development receptor may be one or more of surface tension, electrical (e.g., van de Waals forces) forces, polarity attraction, or other physical forces known to assist in promoting philicity, adsorption or absorption of materials.

In summary, the curable polyurethane elastomeric compositions according to the present invention comprise the reaction products of: 1) an organic diisocyanate composition, which may include a mixture of diisocyanates; 2) a chain extension agent composition including an effective amount of a difunctional hydroxyl reactant containing a carbon-carbon double bond; and 3) a polyol having a molecule weight of at least 500 grams/mole and at least 2 hydroxyl groups which upon reaction of at least those three ingredients generates curable polyurethane elastomeric compositions particularly useful in their cured forms as flexographic printing plate compositions. The invention also describes flexographic printing plate materials comprising a cured polyurethane elastomeric composition having adhered thereto a substrate, which flexographic printing plate materials are produced via a solventless absorption process method utilizing an absorbant sheet material to remove the uncured elastomer portions of the adherant elastomer layer.

It is to be understood that the disclosures made herein are merely exemplary of the invention, which may be embodied in various forms and systems. Therefore, specific details disclosed herein are not to be interpreted as limiting unless so specified. Rather, as the disclosure should be considered support and a representative basis for teaching one skilled in the art to variously practice the present invention in appropriate systems and manners.

The present invention includes within its scope: improved curable polyurethane elastomeric resin compositions; certain cured elastomeric compositions; methods for producing improved flexographic printing plate materials from these curable elastomeric compositions; improved flexographic printing plate materials produced from the improved compositions and an improved method of manufacture. The improved polyurethane elastomeric compositions according to the present invention are generally suitable for curing upon exposure to irradiation, for example ultraviolet (UV) or electron beam (EB) irradiation. The compositions are particularly well suited for use as flexographic printing plates when used in conjunction with a support layer or sheet to which they are adhered.

Curable Polyurethane Elastomeric Compositions

The polyurethane elastomeric compositions according to the present invention include a chain extension agent incorporated into the backbone of a polyurethane polymer, the chain extension agent including therein, and preferably pendant to the polymer backbone, an unsaturation site available for cross-linking the polymer upon irradiation cure. Typically, for preferred embodiments, the unsaturation site is an activated carbon-carbon double bond. Preferred polyurethane elastomeric compositions useful according to the present invention are formed from the following constituents:

(a) an organic diisocyanate;
(b) a preferred chain extension agent according to the present invention having incorporated therein an unsaturation site preferably displaced from the polymer backbone by a spacer group or groups so as to be pendant to the polymer chain following incorporation;
(c) a dihydroxy functional chain extender, preferably containing 2–8 aliphatic carbon atoms, as a reinforcing agent to promote toughness in the polymer;
(d) a hydrophobic macroglycol or higher molecular weight polyol having a molecular weight in the range from about 500 to about 5000 grams/mole, which provides elasticity and energy dissipation capability in the polymeric composition when incorporated between the rather hard urethane segments.

It should be readily understood that the above four constituents may be varied in structure and relative amounts in the curable compositions, in a manner permitting production of elastomeric compositions having a wide variety of chemical and physical performance properties. Desired uncured and cured properties can be readily obtained, and predictably and consistently generated. For example, by varying the relative amounts of diisocyanate (a), and short chain extending diols (b) and (c) as a proportion by weight of the total mass of the curable composition, the durometer or Shore hardness of the elastomer can be varied and controlled. Furthermore, by varying the proportion by weight of the chain extending species (b) to the total mass of the elastomer composition, the cross-link density (average molecular weight between crosslink sites) can be controllably and predictably varied in the cured composition.

Organic diisocyanates useable in forming elastomeric polyurethane compositions according to the present invention may be of a variety of types. Generally, aromatic or cycloliphatic diisocyanates having an average molecular weight of about 160 to about 450 are preferred. These include, for example:
4,4'-di(isocyanatophenyl) methane
4,4'-di(isocyanatocyclohexyl) methane
2,4-toluene diisocyanate
2,6-toluene diisocyanate
p-phenylene diisocyanate
1,4-di(isocyanato) cyclohexane
isophorone diisocyanate The remaining above described chemical reactant constituents utilized in forming the elastomeric polyurethane compositions generally comprise diols, each having preferred characteristics to impart certain desired chemical and physical properties to the resulting polyurethane elastomer. A first of these is a chain extending diol component having a relatively low hydroxyl equivalent eight, mentioned above as component (c), which reacts with isocyanate moities to form relatively short-chain, hard, tough, segments in the backbone of the polyurethane polymer. Preferred diol components (c) are: 1,2-ethylene glycol; propylene glycol; 1,4-butane diol; diethylene glycol; dipropylene glycol; and triethylene glycol.

The relatively high molecular weight macroglycol (polyol) component (d) utilized in preparing the polyurethane elastomeric compositions according to the present invention are extended chain diols, which, following reaction act as soft, low Tg, energy dissipating, hydrophobic segments in the resulting polyurethane elastomers. Suitable macroglycols which can be utilized are those polyether polyols having an average hydroxyl functionality of 2 to 3 and an average hydroxyl equivalent weight of from about 250 to about 5000, preferably from about 1000 to about 3500. Suitable polyether polyols which can be employed include those which are prepared by reacting an alkylene oxide, or halogen substituted alkylene oxide or mixtures thereof with an active hydrogen containing compound. Prefered oxides are 1,2-butylene oxide and epichlorohydrin either alone or in combination.

Improvements according to the present invention can also result from incorporation of yet a third class of diol compound into the polymer forming reaction mixture. This optional third class of diol compound may be used to introduce further characteristics to the resulting polyurethane elastomeric composition. In particular, the third class of component comprises a relatively low molecular weight chain extension agent which is difunctional in hydroxyl groups and also includes an unsaturated moiety, generally pendant to the resulting polymer chain. In a surprising aspect, by judicious selection of this species with particular regard for its structural features, this unsaturated diol provides a dual function of being both a curable moiety which provides for radiation curability but also, and just as important, a reduction of the melting temperature of the elastomeric composition to temperatures as low as about 85° C. These features further enable the production of a flexographic printing plate produced via irradiation induced curing of the elastomeric composition, followed by removal of the uncrosslinked elastomer portions by absorption by an absorbant material at temperatures above the melting point of the uncured elastomeric composition, which temperatures are well below the heat distortion temperatures of the support layer beneath the cured elastomeric layer in the printing plate. Preferably the unsaturated diol comprises an unsaturation site with an activated carbon-carbon double bond. This activated double bond is thus readily available and particularly reactive for cross-linking reaction upon exposure to activating irradiation.

The term "activated", or variants thereof when used in association with an unsaturated moiety of an agent according to the present invention, refers to a basic type of unsaturation site which is activated in the sense that free radicals formed thereat will be stabilized by other groups in the molecule, hence facilitating the free radical reaction. Such activated double bonds include, for example, the carbon-carbon double bonds of alpha-beta unsaturated carbonyl compounds, for example acrylates, methacrylates, and acrylamides.

Preferred activated unsaturation moiety-including chain extending diols include: 1-, or 2-glycerol acrylate or methacrylates; trimethylolethane monoacrylate or methacrylate; and N,N-bis(2-hydroxy ethyl)-N'-(methacryloxyethyl) urea.

In curable elastomeric compositions according to the present invention, generally at least 1 activated unsaturation moiety should be introduced for about every 500–15,000 or preferably every 2,000–10,000 molecular weight units of elastomer polyurethane. This can be readily controlled and repeated and is a function of the reactivity and/or amount(s) of reactant(s) used in forming the polyurethane. Substantially higher quantities of unsaturation moiety may lead to a relatively highly crosslinked, and therefore brittle, cured composition. Such a composition may have utility in many applications, but not typically those involving a resilient flexographic printing plate. Substantially less incorporation of unsaturated moieties will generally result in insufficient cross-linking or cure of the elastomer as required to resist flow above the elastomer melt transition temperature which flow will result in permanent undesired distortion of the printing plate surface rendering the printed matter produced from it as unacceptable.

Formation of the Curable Elastomeric Compositions

The curable elastomeric compositions can be produced by any of a number well known solvent based or melt polymerization techniques. Melt polymerization techniques such as one shot, pre-polymer with hand casting, reaction injection molding, or reactive extrusion techniques, are preferred since these methods can eliminate solvents and solvent drying.

Particularly preferred techniques are those involving reactive extrusion utilizing multi-screw extrusion equipment such as counter rotating twin-screw extrusion equipment.

The percent by weight change of the cured elastomer composition when immersed in various liquids is determined by the following procedure:

Test strips of cured elastomer of dimensions 12.7 mm×25.4 mm×0.4 mm are weighed to the nearest 0.0001 gram (S1). The strips are then placed in sufficient liquid as to be fully immersed and equilibrated for 24 hours. After careful removal using a forceps, excess liquid is removed from the test strip using an absorbant towel, and the strip is reweighed to the nearest 0.0001 gram (S2). The percent of swelling (% Swell) is calculated by the following equation:

$$\% \text{ Swell} = \frac{S2 - S1}{S1} \cdot 100$$

The percentage of gell (% Gel) after curing the elastomer compositions is determined by the following procedure:

Test strips 12.7 mm × 102 mm × 0.4 mm are weighed to the nearest 0.0001 gram (G1). The strips are immersed in 50 grams of tetrahydrofuran and allowed to soak for 24 hours. The swollen strips are carefully removed from the solvent using a forceps, excess solvent is removed from them with an absorbent material and the strips are placed in a pre-weighed aluminum pan. The strips are allowed to air dry for 8 hours followed by drying for 8 hours in a vacuum oven maintained at 80° C. and 29 inches of mercury vacuum. The strips/pan are re-weighed with the gel weight (G2) being determined by difference. The % Gel is calculated as follows:

$$\% \text{ Gel} = \frac{G2}{G1} \cdot 100$$

The storage modulus, $E'$, loss modulus, $E''$, and loss tangent $\sigma$, of the elastomeric compositions are determined utilizing commercially available measuring equipment, in this case a Rheovibron Analyzer (product of the Toyo-Baldwin Co.—Tokyo, Japan) using the following procedure:

Test strips of approximately 3.8 mm × 70 mm × 0.4 mm are placed between the jaw clamps of the Rheovibron apparatus. The sample is tensioned slightly and then cooled to $-50°$ C., at which point a sinusoidal tension is applied from the driver side of the apparatus at a frequency of 11 Herz while the sample temperature is elevated at the rate of $+3°$ C. per minute. The resulting tension applied through the sample to the other support arm and its phase shift in degrees from the driving tension are measured and used to calculate $E'$, $E''$, and Tan $\sigma$ (tangent of the angle $\sigma$).

The melt index of the molten uncured elastomer compositions is determined according to ASTM No. D 1238-70 as follows. Five (5.0) grams of elastomer pellets are loaded into the heated chamber of a Tinius-Olsen Extrusion Plastometer, which chamber is equilabrated at a temperature of 153°+/−0.5° C. A load of 1100 grams mass is applied to the melting elastomer in the chamber, which load acts to force the molten elastomer composition from the small orifice at the bottom of the Plastometer chamber. After 5 minutes, during which period the polymer flow tends toward equilibrium, a sample of extruded elastomer is collected over a 20 second interval and weighed as M1. The melt index is then calculated using the following equation:

Melt Index = M1 × 30 [having the units of grams/10 minutes]

EXAMPLE 1A

Curable Elastomer Composition from 2-Glycerol Methacrylate Unsaturated Diol and Poly 1,2-(butylene oxide) Diol A radiation curable polyurethane elastomeric composition was prepared in a twin-screw extrusion reactor as follows:

I. A polyol mixture was prepared of the following components which were thoroughly mixed in a feed tank until homogenious:
  A. 286.1 parts (0.2861 moles) of a 1000 molecular weight poly 1,2-(butylene oxide) diol (Dow Chemical Co.);
  B. 32.8 parts (0.3644 mole) of 1,4-butane diol (GAF Chemical Co.)
  C. 10.7 parts (0.0669 mole) of 2-glycerol methacrylate (3M Co.);
  D. 10.6 parts of diethoxy acetophenone (Irgacure-651,Ciba-Geigy Co.)
  E. 0.1 part methylene blue
  F. 0.06 part ferric chloride
  G 0.26 part dibutyl tin dilaurate II. A precision flow metering system was utilized to meter the above polyol stream into the inlet port of a 64 mm twin-screw counter rotating extruder (Leistritz Co.) at a ratio of 62.47 parts by weight of polyol stream to 37.53 parts by weight 4,4'-bis-(isocyanato cyclohexyl) methane (Desmodur W ™, Mobay Chemical Co.). At this mass ratio, there was a slight equivalency excess of isocyanate moities in the feed stream relative to hydroxyl moieties. The reaction temperature of the polymerizing mass was maintained in the range of 150° to 170° C. as polymerization occurred in the extruder. Upon exiting from the extruder, the fully reacted curable elastomer composition was segregated into pellets having diameters of approximately 0.3 cm which were collected for further processing. The completeness of the polymerization reaction was determined by monitoring the infrared spectrum of a cast film of the curable elastomer product and determining the absorbance ratio of the —NCO absorption band (2250 cm-1) to the —CH2— absorption band (2950cm-1). A ratio of less than 0.2 indicated a complete reaction with only a slight excess of —NCO groups remaining. The melt index of the curable elastomer composition was monitered at a temperature of 153° C. using a load of 1100 grams on the heated chamber of the Extrusion Plastometer and found to be in the range between 10 and 20 grams per 10 minute interval.

The fully reacted curable polyurethane elastomeric Composition 1A consisted of the following mole ratios of constituents:

| Component | Moles |
|---|---|
| 4,4'-bis(isocyanato cyclohexyl)methane | 2.730 |
| 1,4 butane diol | 1.274 |
| 2-glycerol methacrylate | 0.234 |
| poly 1,2 (butylene oxide)diol | 1.000 |

EXAMPLE 1B

Curable and Cured Elastomeric Films, and Flexographic Printing Plates from Composition 1A The radiation curable polyurethane elastomeric Composition 1A described in Example 1A was reextruded into a curable flexographic printing plate construction utilizing a 125 mm single screw extrusion device as follows. Curable elastomer pellets of Composition 1A were charged into the feed hopper of the extruder. The temperatures of the heated zones of the extruder were maintained between 130° and 160° C. during the experiment. A film extrusion die was utilized at the exit of the extruder to allow casting of the extrudate onto a polyethylene terephthalate film base of 0.18 mm thickness to form the planar contiguous curable elastomeric layer of the flexographic printing plate. Prior to beginning the extrusion step, the major portion of the film base had been coated with a priming composition comprising a tris-aziridine compound (as disclosed in EPO Publication 0 206 669) to enhance adhesion of the extruded layer. The extrudate was introduced into a controlled orifice gap consisting of two rotating chill rolls maintained at 20°-25° C. An unprimed top film of polyethylene terephthalate of 0.08 mm thickness was introduced into this gap also to serve as a protective film over the curable elastomeric layer prior to formation of the flexographic printing plate by irradiation induced curing. A portion of the extrudate was applied to unprimed 0.18 mm film base for the purpose of measuring % Gel, and % Swell after cure and physical properties (tensile strength and modulus at room temperature, and dynamic thermomechanical properties).

A continuous roll of multi-layered product of thickness 0.66 mm was thus produced having a curable elastomeric layer of Composition 1A of thickness 0.4 mm more or less in combination with a support sheet of polyethylene terephthalate film of 0.18 mm thickness and a removable top film of 0.08 mm thickness.

A portion of the extruded curable elastomeric composition which had been applied to unprimed film base was cured by exposure for 10 minutes duration at an intensity of 11,200 millijoules/cm² to actinic radiation utilizing a vacuum frame ultraviolet light exposure unit (Kelleigh Model #210 flexographic plate exposure unit). Physical properties before and after cure were evaluated by tensile strength testing according to ASTM D 1708 at a crosshead speed of 30 cm/minute. Results are summarized in Table I. Dynamic thermomechanical testing to determine storage modulus E', loss modulus E", and Tan σ was done as previously described. The results are graphically displayed in FIG. 1. The % Gel was determined to measure the degree of insolubility produced by radiation curing and is summarized in Table II. The % Swell of the cured elastomeric composition after immersion in water and water/alcohol mixtures for 24 hours was determined as a measure of the resistance of that composition against swelling in various water based ink formulations, and is summarized in Table III.

TABLE I

| Example | Tensile Strength kg/cm2 | Physical Properties of Uncured & Cured Films | | |
|---|---|---|---|---|
| | | Elastic Modulus kg/cm2 | Modulus kg/cm2 | % Elongation |
| 1B-uncured | 280.4 | 208.5 | 43.7 | 510.0 |
| 1B-cured | 267.7 | 105.7 | 59.9 | 343.0 |
| 2B-uncured | 201.5 | 199.4 | 42.0 | 500.0 |
| 2B-cured | 208.5 | 210.7 | 71.9 | 276.4 |
| 3B-uncured | | | | |
| 3B-cured | | | | |

The data demonstrate the elastic properties of the uncured and cured elastomeric compositions.

TABLE II

| Example | % Gel (24 hours extraction in THF) after UV Curing Exposure |
|---|---|
| 1B-uncured | 0 |
| 1B-cured | 79.2 |
| 2B-uncured | 0 |
| 2B-cured | 92.1 |
| 3B-uncured | 0 |
| 3B-cured | |

The data demonstrate the conversion during radiation exposure of the uncured elastomeric compositions to relatively insoluble cured compositions having % Gel contents in excess of 70%.

TABLE III

| Example | 100% H2O | % Swell (24 hours immersion in 98/2 H2O/ glycerine | 95/5 H2O/ n-propanol | 87.5% H2O/) isopropanol* |
|---|---|---|---|---|
| 1B-cured | 0.78 | 0.83 | 1.78 | 1.8 |
| 2B-cured | | | | |
| 3B-cured | | | | |

*pH adjusted to 9.2 with ammonia (aq).

The data demonstrate the excellent resistance to swelling of the cured elastomeric compositions of the present invention in various water and water/alcohol mixtures as representative of water based flexographic ink formulations.

One-meter long sections of the multi-layered product described in the previous two paragraphs were irradiated with ionizing radiation from an Electrocurtain TM electron beam irradiation device (product of Energy Sciences, Inc.) as follows. The accelerating potential of the electrons eminating from the unit was preset to 240 kiloelectron volts. The product section was exposed to the electron beam energy in an orientation so that the beam energy was directed toward the product from the 0.4 mm polyester film support side. In this manner, the portion of the curable elastomer layer in contact with the primed polyester film base received the greatest irradiation energy. The energy dose was controlled so that the product received an absorbed dose of 5 megarads as measured at the point at which the beam entered the product surface. This exposure step was accomplished over the entire product area so as to partially cure, or render unmeltable, and insoluble, a portion of the curable elastomeric layer, particularly that portion in direct contact with the polyester support base.

An imagewise exposure of the planar contiguous elastomeric layer was next accomplished as follows. The polyester top film (0.08 mm) was removed from the elastomeric layer of the curable elastomeric layer. A thin coating of a water dispersed urethane resin which contained small beads of silicon dioxide of approximately 20 microns in diameter was applied to the exposed surface of the curable elastomeric layer and allowed to air dry for a few minutes. A silver halide photographic exposure negative (of the type in common use in the graphic arts industry) which contained picture information in the form of the magenta separation obtained from a 35 mm photographic slide of a clown (which separation was produced utilizing a film scanner (Hell Corporation) at 52.4 line screen per inch definition) was placed in contact with the urethane resin/silicon dioxide coated side of the curable elastomeric layer. This multilayered "sandwich" was placed in the vacuum exposure frame contained in a Kelleigh flexographic plate processor (Model #210). The top film attached to the exposure frame was drawn over the "sandwich", vacuum was applied, and the air was exhausted between the exposure negative and the curable elastomer surface. Ultraviolet light exposure of the plate through the photographic negative was then performed for a 6 minute period, after which the evacuation was terminated, and the exposure negative removed. A visible image was noted in the UV exposed areas of elastomeric layer (photobleaching had occurred which rendered the exposed areas transparent and a light yellow color) while the unexposed areas remained light blue in color. Removal of the unexposed and uncured areas of the elastomeric layer (to complete the manufacture of a flexographic printing plate) was next accomplished as follows. Sections of non-woven spun-bonded nylon porous web (CEREX TM spun-bonded nylon, a product of James River Corp.) of basis weight 66 grams/square meter were cut in size to match the area of the plate to be processsed. A layer of the non-woven web was placed in contact with the elastomer layer of the exposed plate. The laminate was placed on a heated platten equilibrated to 135° C. with the polyester film surface of the plate in contact with the platten. Directly adjacent to the platten were two heated, rubber covered, nip rolls which were moving in counter-rotation at a linear speed of 30 cm/minute and which were gapped so as to lightly compress the laminate of non-woven/plate as it was introduced into the nip roll gap. After a few seconds of warm-up time on the platten, the laminate was gently pushed into the nip roll gap. As the "sandwich" eminated from the heated nip, the CEREX TM non-woven web was gently lifted from the heated elastomer surface with steady tension. It was noted that the non-cured areas of the elastomer layer of the plate had been removed via absorption of the thermoplastic uncured portions of the elastomer into the non-woven web. A half-tone image of the clown at 52.4 lines/cm was evident in the cured elastomeric layer of the plate. Two additional trips of the cured product through the heated nip of the laminator with fresh CEREX TM non-woven web sections were required to complete the removal of the unexposed areas of the plate. In a similar manner, the other photographic negative color separations (black, cyan, yellow) of the clown slide were processed into flexographic printing plates for use in color printing.

Printing was accomplished utilizing a 5 station Webtron TM Model 525 flexographic printing press and water based flexographic printing inks (Louis Werneke Co.) with a tag and label printing base being utilized. Printing was done under standard conditions utilized in traditional flexographic printing practice. An excellent rendition of the clown picture was reproduced in this way.

To further demonstrate the utility and value of the electron beam exposure, and resulting curing step, the following experiment was conducted. Sections of the extruded curable elastomeric composition which had been applied to the primed polyester film base were exposed to ionizing radiation from an Electrocurtain TM electron beam exposure device as previously described. The beam to product orientation was again arranged so as to allow the ionizing beam of radiation to enter the product through the 0.4 mm film support side. In this case however the accelerating voltage of the electrons was varied over the range from 240 KeV to 280 KeV in steps of 10 KeV, while the dose was maintained at 5 megarads. Following exposure to ionizing radiation, the uncured portions of the elastomeric layer were removed by adsorption into CEREX TM non-woven nylon web as described above in the production of the flexographic printing plates containing the clown seperations. After removal of the uncured elastomer was complete, the remaining caliper of cured elastomer and its adherent polyester film base was determined by measurement utilizing a digital micrometer. A total of four measurements of each sample was made to allow determination of error in the methods. The thickness measurement is referred to as the floor thickness of the plate and will be that thickness down to which removal of uncured elastomer will be successful following imagewise exposure of the flexographic plate. The total caliper of the printing plate is controlled by the extrusion process and is set by imagewise exposure. The relief depth of the printing areas of the plate is determined by calculating the difference between the total plate caliper and the floor thickness of the plate. For example, for a total plate caliper of 22 mils, and a pre-set floor of 16 mils (as obtained from exposure to electron beam irradiation utilzing a beam having 240 KeV of penetrating power), a relief of 6 mils would be obtained in the final flexographic printing plate. The use of ionizing electron beam radiation exposure thus allows the manufacturer to control the floor thickness of a flexographic plate in a systematic way. Further unexpected benefits of the electron beam exposure step will become apparent in further examples

EXAMPLE 2A

Curable Elastomeric Composition from N,N-Bis(2-hydroxyethyl),N'-(methacryloxy ethyl) urea unsaturated diol and poly 1,2-(butylene oxide) diol Preparation of Unsaturated diol:

A 10 gallon glass lined Pfaudler chemical reaction vessel was utilized for the reaction. The following materials were used.

| Component | Kg. | Kg-Moles |
|---|---|---|
| A. Diethanol amine (Dow Chemical Co.) | 7.22 | 0.0687 |
| B. poly 1,2-(butylene oxide)diol (Dow) | 9.09 | 0.0091 |
| C. 2-isocyanato ethyl methacrylate (distilled under vacuum - Dow Chemical Co.) | 10.96 | 0.07 |
| D. Phenothiazine | 8.2 grams | — |

Components A and B were charged to the vessel under vacuum and cooled to a temperature of 20° C. with agitation. Component D was added while a nitrogen gas blanket was established in the vessel after which component C was slowly metered into the reactor while cooling the reactor jacket with cold water. The addition rate was controlled so as to maintain the reaction temperature below 40° C. The addition of component C was complete after 1 hour of addition time. After allowing 15 minutes for the reaction to be completed, a small sample of the reaction mixture was withdrawn and examined by infrared spectroscopy for the presence of residual isocyanate moieties. A very slight absorption band at 2250 cm-1 was noted, indicating the desired slight excess of —NCO in the reaction mixture. The contents of the reactor were drained into lined pails and held for further use as described below. The resulting N,N-Bis(2-hydroxyethyl)-N'-(methacryloxy ethyl)urea unsaturated diol product was further characterized by 1H and 13C NMR to establish its structure and purity.

A radiation curable polyurethane elastomeric composition was prepared from the above unsaturated diol as follows.

I. A polyol mixture was prepared of the following components which were thoroughly mixed in a feed tank until homogenious:
  A. 260 parts (0.26 moles) of a 1000 molecular weight poly 1,2-(butylene oxide) diol (Dow Chemical Co.);
  B. 29.7 parts (0.33 mole) of 1,4-butane diol (GAF Chemical Co.)
  C. 22.97 parts of reaction product above containing 0.0606 mole of N,N-Bis (2-hydroxyethyl)-N'-(methacryloxy ethyl)urea and 0.0007 mole of poly 1,2(butylene oxide) polyol
  D. 5.0 parts of diethoxy acetophenone (Irgacure-651, Ciba-Geigy Co.)
  E. 0.1 part methylene blue
  F. 0.06 part ferric chloride
  G. 0.25 part dibutyl tin dilaurate II. A precision flow metering system was utilized to meter the above polyol stream into the inlet port of a 64 mm twin-screw counter rotating extruder (Leistritz Co.) at a ratio of 63.17 parts by weight of polyol stream to 36.83 parts by weight 4,4'-bis (isocyanato cyclohexyl) methane (Desmodur TM W- Mobay Chemical Co.). At this mass ratio, there was a slight equivalency excess of isocyanate moities in the feed stream relative to hydroxyl moities. The reaction temperature of the polymerizing mass was maintained in the range of 150° to 170° C. as polymerization occurred in the extruder. Upon exiting from the extruder, the fully reacted curable elastomer composition was segregated into pellets of diameter of approximately 0.3 cm which were collected for further processing. The completeness of the polymerization reaction was determined by monitoring the infrared spectrum of a cast film of the curable elastomer product and determining the absorbance ratio of the —NCO absorption band (2250 cm-1) to the —CH 2—absorption band (2950cm-1), which ratio proved to be less than 0.2 indicating a complete reaction with only a slight excess of —NCO groups remaining. The melt index of the curable elastomer composition was monitered at a temperature of 153° C. using a load of 1100 grams on the heated chamber of the Extrusion Plastometer and found to be in the range between 5 and 10 grams per 10 minute interval.

The fully reacted curable polyurethane elastomeric Composition 2A consisted of the following mole ratios of constituents:

| Component | Moles |
| --- | --- |
| 4,4'-bis(isocyanato cyclohexyl)methane | 2.730 |
| 1,4-butane diol | 1.266 |
| N,N-Bis (2-hydroxyethyl), N'-(methacryloxy ethyl)urea | 0.233 |
| poly 1,2-(butylene oxide)diol | 1.000 |

By calculation, Composition 2A possesses one unsaturated crosslinking site per every 5,167 molecular weight units.

EXAMPLE 2B

Curable and Cured Elastomeric Films, and Flexographic Printing Plates from Experiment 2A, Composition 2A The radiation curable polyurethane elastomeric Composition 2A described in Example 2A was reextruded into a curable flexographic printing plate construction utilizing a 125 mm single screw extrusion device as follows. Curable elastomer pellets of Composition 2A were charged into the feed hopper of the extruder. The temperatures of the heated zones of the extruder were maintained between 130° and 160° C. during the experiment. A film extrusion die was utilized at the exit of the extruder to allow casting of the extrudate onto a polyethylene terephthalate film base of 0.18 mm thickness for the purpose of forming the planar contiguous curable elastomeric layer of the flexographic printing plate. Prior to beginning the extrusion step, the major portion of the film base had been coated with a priming composition to enhance adhesion of the extruded layer. The extrudate was introduced into a controlled orifice gap consisting of two rotating chill rolls maintained at 20°-25° C. An unprimed top film of polyethylene terephthalate of 0.08 mm thickness was introduced into this gap also to serve as a protective film over the curable elastomeric layer prior to formation of the flexographic printing plate by irradiation induced curing. A portion of the extrudate was applied to unprimed 0.18 mm film base for the purpose of measuring % Gel, and % Swell after cure and physical properties (tensile strength and modulus at room temperature, and dynamic thermomechanical properties).

A continuous roll of multi-layered product of thickness 0.66 mm was thus produced having a curable elastomeric layer of Composition 1A of thickness 0.4 mm more or less in combination with a support sheet of polyethylene terephthalate film of 0.18 mm thickness and a removable top film of 0.08 mm thickness.

A portion of the extruded curable elastomeric composition which had been applied to unprimed film base was cured by exposure for 10 minutes duration to actinic radiation utilizing a vacuum frame ultraviolet light o exposure unit (Kelleigh Model #210 flexographic plate exposure unit). Physical properties before and after cure were evaluated by tensile strength testing according to ASTM D 1708 at a crosshead speed of 30 cm/minute. Results are summarized in Table I. Dynamic thermomechanical testing to determine storage modulus E', loss modulus E'', and Tan σ were determined by Rheovibron TM analysis and are summarized as follows: Per Cent (%) Gel was determined to measure the degree of insolubility produced by radiation curing and is summarized in Table II. The % Swell of the cured elastomeric composition after immersion in water and water/alcohol mixtures for 24 hours was determined as a measure of the resistance of that composition against swelling in various water based ink formulations, and is summarized in Table III.

One-meter long sections of the multi-layered product described in the previous two paragraphs were irradiated with ionizing radiation from an Electrocurtain TM electron beam irradiation device (product of Energy Sciences, Inc.) as follows. The accelerating potential of the electrons eminating from the unit was preset to 240 kiloelectron volts. The product section was exposed to the electron beam energy in an orientation so that the beam energy was directed toward the product from the 0.4 mm polyester film support side. In this manner, the portion of the curable elastomer layer in contact with the primed polyester film base received the greatest irradiation energy. The energy dose was controlled so that the product received an absorbed dose of 5 megarads as measured at the point at which the beam entered the product surface. This exposure step was accomplished over the entire product area so as to partially cure, or render unmeltable, and insoluble, that portion of the curable elastomeric layer in direct contact with the polyester support base.

An imagewise exposure of the planar contiguous elastomeric layer was next accomplished as follows. The polyester top film (0.08 mm) was removed from the elastomeric layer of the curable elastomeric layer. A thin coating of a water dispersed urethane resin which contained small beads of silicon dioxide of approximately 20 microns in diameter was applied to the exposed surface of the curable elastomeric layer and allowed to air dry for a few minutes. A silver halide photographic exposure negative (of the type in common use in the graphic arts industry) which contained graphic arts test patterns with half-tone dots from 65 to 150 line screen at % dot densities from 2% to 95% was placed in contact with the urethane resin/silicon dioxide coated side of the curable elastomeric layer. This multilayered "sandwich" was placed in the vacuum exposure frame contained in a Kelleigh flexographic plate processor (Model #210). The top film attached to the exposure frame was drawn over the "sandwich", vacuum was applied, and the air was exhausted between the exposure negative and the curable elastomer surface. Ultraviolet light exposure of the plate through the photographic negative was then accomplished for a 6 minute period, after which the evacuation was terminated, and the exposure negative removed. A visible image was noted in the UV exposed areas of elastomeric layer (photobleaching had occurred which rendered the exposed areas transparent and a light yellow color) while the unexposed areas remained light blue in color. Removal of the unexposed and uncured areas of the elastomeric layer (to complete the manufacture of a flexographic printing plate) was next accomplished as follows. Sections of non-woven spun-bonded nylon porous web (CEREX TM spunbonded nylon, a product of James River Corp.) of basis weight 66 grams/square meter were cut in size to match the area of the plate to be processsed. A layer of the non-woven web was placed in contact with the elastomer layer of the exposed plate. The laminate was placed on a heated platten equilibrated to 135° C. with the polyester film surface of the plate in contact with the platten Directly adjacent to the platten were two heated, rubber covered, nip rolls which were moving in counter-rotation at a linear speed of 30 cm/minute and which were gapped so as to lightly compress the laminate of non-woven/plate as it was introduced into the nip roll gap. After a few seconds of warm-up time on the platten, the laminate was gently pushed into the nip roll gap. As the "sandwich" eminated from the heated nip, the CEREX TM non-woven web was gently lifted from the heated elastomer surface with steady tension. It was noted that the non-cured areas of the elastomer layer of the plate had been removed via absorption of the uncured thermoplastic portions of the elastomer into the non-woven web. A flexographic printing plate was produced having a half-tone relief image which matched the pattern of the exposure negative. Two additional trips of the cured product through the heated nip of the laminator with fresh CEREX TM non-woven web sections were required to complete the removal of the unexposed areas of the plate.

Printing was accomplished using a 0.4 meter wide GALLUS Comco flexogrpahic printing press, water based flexographic printing inks (Louis Werneke Co.) and a pressure sensitive adhesive backed tag and label printing substrate. Excellent tonal reproduction of the original test negative was noted in the printed samples.

The ionizing radiation used to create the floor, or the cured elastomer zone between the substrate and the unirradiated elastomer can effectively be used to control the thickness of the floor or anchoring zone. Ionizing radiation attenuates in the composition in direct proportion to its energy. The thickness of the zone varies almost exactly linearly with the intensity of the radiation used (given a constant time exposure). For example, with this Example, a 200 Kv exposure produces an 8 mil (0.250 mm) floor, 210 Kv a 10 mil (.254 mm) floor, and 240 Kv a 14 mil (0.332 mm) floor.

Another unique aspect of the present invention is the recyclable nature of the developmentally removed composition and the development sheet. After removal of the unexposed composition from the photosensitive article, the absorbent layer with the composition therein can be further treated to remove the absorbed or entrapped composition and reuse both the recovered composition and the absorbent layer. The composition can be removed simply by blowing heated air (above the softening temperature of the composition) through the absorbent layer so that the composition softens enough to be forced out of the absorbent layer into a receiving tray or vessel. The hot air may be blown by a slot vent over the width of the absorbent layer or the layer may be wrapped or carried about a drum with heated air directed out of the drum and through the layer. The less viscous the composition is made by heating, the less force is needed to remove it. The combination of heating and forced air can eject the composition in the form of droplets which are directed towards a cooling bath (e.g., water). They will then form pellets which can be reheated/redissolved and be coated out again onto a printing plate surface. The recycled pellets would probably be combined with virgin formulation to assure that any property changes occurring during development and recycling were minimzed.

EXAMPLE 3A

Curable Elastomer Composition from N,N-Bis)2-hydroxyethyl), N'-(methacryloxy-ethyl)urea unsaturated diol and poly-1,2-(butylene oxide) diol A radiation curable polyurethane elastomeric composition was prepared in a twin-screw extrusion reactor as follows:

I. A polyol mixture was prepared of the following components which were thoroughly mixed in a feed tank until homogenious:
- A. 36.9 parts (0.0369 moles) of a 1000 molecular weight poly-1,2-(butylene oxide) diol (Dow Chemical Co.);
- B. 7.8 parts (0.0867 mole) of 1,4-butane-diol (GAF Chemical Co.)
- C. 4.4 parts of a mixture of 2.97 parts (0.0115 moles of N,N-Bis(2-hydroxyethyl), N'-(methacryloxy ethyl)urea unsaturated diol and 1.43 parts (0.0014 mole) of the same polyol as in charge A;
- D 0.5 parts of α,α diethoxy acetophenone (Irgacure-651, Ciba Geigy Co.)
- E. 0.015 part methylene blue
- F. 0.01 part ferric chloride
- G. 0.04 part dibutyl tin dilaurate II. A precision flow metering system was utilized to meter the above polyol stream into the inlet port of a 34 mm twin-screw counter rotating extruder (Leistritz Co.) at a ratio of 57.13 parts by weight of polyol stream to 42.87 parts by weight 4,4'-bis-(isocyanato cyclohexyl) methane (Desmodur ™ W-Mobay Chemical Co.). At this mass ratio, there was a slight equivalency excess of isocyanat emoieties in the feed stream relative to hydroxyl moisties. The reaction temperature of the polymerizing mass was maintained in the range of 150° to 150° C. as polymerization occurred in the extruder. Upon exitting the extruder, the fully reacted curable elastomer composition was segregated into pellets of diameter of approximately 0.3 cm which were collected for further processing. The completeness of the polymerization reaction was determined by monitoring the infrared spectrum of a cast film of the curable elastomer product and determining the absorbance ratio of the —NCO absorption band (2250 cm$^{-1}$) to the —CH$_2$— absorption band (2950cm$^{-1}$), which ratio proved to be less than 0.2 indicating a complete reaction with only a slight excess of —NCO groups remaining. The melt index of the curable elastomer composition was monitered at a temperature of 160° C. using a load of 1100 grams on the heated chamber of the Extrusion Plastometer and found to be in the range between 10 and 20 grams per 10 minute interval.

The fully reacted curable polyurethane elastomeric Composition 3A consisted of the following mole ratios of constituents:

| Component | Moles |
| --- | --- |
| 4,4'-bis-(isocyanato cyclohexyl)methane | 3.703 |
| 1,4-butane-diol | 2.262 |
| N,N-Bis(2-hydroxyethyl),N'-(methacryloxy ethyl)urea | 0.299 |
| poly 1,2-(butylene oxide)-diol | 1.000 |

By calculation, Composition 3A possesses one unsaturated crosslinking site per every 7,530 molecular weight units, and 55.6% by weight hard segment units.

EXAMPLE 4A

Curable Elastomer Composition from N,N-Bis(2-hydroxyethyl), N'-(methacryloxy ethyl)urea unsaturated diol, poly-1,2-(butylene-oxide)-diol and poly-(epichloridrin)-diol A radiation curable polyurethane elastomeric composition was prepared in a twin-screw extrusion reactor as follows:

I. A polyol mixture was prepared of the following components which were thoroughly mixed in a feed tank until homogenious:
- A. 13.0 parts (0.0130 moles) of a 1000 molecular weight poly 1,2-(butylene oxide)-diol (Dow Chemical Co.);
- B. 13.0 parts 90.0059 moles) of a 2200 molecular weight poly-epichlorohydrin-diol) (3M Co.);
- C. 6.4 parts (0.0711 mole) of 1,4-butane diol (GAF Chemical Co.)
- D. 3.14 parts of a mixture of 2.13 parts (0.008 moles of N,N-Bis(2-hydroxyethyl), N'-(methacryloxy ethyl) urea unsaturated diol and 1.01 parts (0.0010 mole) of the same polyol as in charge A;
- E. 0.5 parts of α,α diethoxy acetophenone (Irgacure-651, Ciba-Geigy Co.);
- F. 0.01 part methylene blue
- G. 0.007 part ferric chloride
- H. 0.03 part dibutyl tin dilaurate II. A precision flow metering system was utilized to meter the above polyol stream into the inlet port of a 34 mm twin-screw counter rotating extruder (Leistritz Co.) at a ratio of 57.76 parts by weight of polyol stream to 42.24 parts by weight 4,4'-bis (isocyanato cyclohexyl) methane (Desmodur ™ W-Mobay Chemical Co.). At this mass ratio, there was a slight equivalency excess of isocyanate moieties in the feed stream relative to hydroxyl moieties. The reaction temperature of the polymerizing mass was maintained in the range of 150° to 170° C. as polymerization occurred in the extruder. Upon exiting from the extruder, the fully reacted curable elastomer composition was segregated into pellets of diameter of approximately 0.3 cm which were collected for further processing. The completeness of the polymerization reaction was determined by monitoring the infrared spectrum of a cast film of the curable elastomer product and determining the absorbance ratio of the —NCO absorption band (2250 cm$^{-1}$) to the —CH$_2$— absorption band 2950 cm$^{-1}$), which ratio proved to be less than 0.2 indicating a complete reaction with only a slight excess of —NCO groups remaining. The melt index of the curable elastomer composition was monitered at a temperature of 160° C. using aload of 1100 grams on the heated chamber of the Extrusion Plastometer and found to be in the range between 25 and 35 grams per 10 minute interval.

The fully reacted curable polyurethane elastomeric Composition 4A consisted of the following mole ratios of constituents:

| Component | Moles |
| --- | --- |
| 4,4'-bis-(isocyanato cyclohexyl)methane | 5.246 |
| 1,4-butane diol | 3.760 |
| N,N-Bis(2-hydroxyethyl), N'-(methacryloxy ethyl)urea | 0.432 |
| poly 1,2-(butylene oxide)-diol | 0.6875 |
| poly(epichlorohydrin)diol | 0.3125 |

By calculation, Composition 4A possesses one unsaturated crosslinking site per every 7,401 molecular weight units, and 57% by weight hard segment units.

EXAMPLE 5B

A flexographic printing plate was prepared using the absorption melt processing method utilizing a DuPont PLS flexographic plate product. The sheet flexo plate making material was removed from the shipping carton and cut into a 30 cm×30 cm square section. Backside irradiation was accomplished in a Kelleight Model #210 plate exposure/processor unit for a period of 20 seconds. Following this step, the protective cover film was removed and a graphic arts test negative film was applied to the surface of the plate with the cover film attached to the exposure unit then applied to this "sandwich." After a 2 minute period during which air was exhausted between the exposure negative and the curable elastomer surface, an imagewise exposure was accomplished for a period of 10 minutes. After bleeding of the vacuum and removal of the exposure negative, the plate was developed by removal of the unexposed and uncured areas of the elastomeric layer using the absorption method in the same manner as described in Example 2B. A total of (6) passes of the plate material through the heated laminator rolls was required to remove at least 90% of the unexposed and uncured portions of the elastomer layer. Fresh non-woven CEREX ™ web material was utilized for each pass so as to allow for maximum absorption to occur. Excellent definition of the relief areas of the resulting printing plate sample was apparent as determined by visual inspection using a hand-held microscope of 10X magnifying power. The total caliper of the printing plate was 1.7 mm with a relief depth measured at 1.0 mm for the raised areas of the plate.

EXAMPLE 6B

A flexographic printing plate was prepared utilizing the absorption processing method using a BASF Nyloflex flexographic plate product. After removal of the product from the packaging carton, a section was cut having dimensions of 10 cm×20 cm×2.84 mm. The backside and imagewise exposure were exactly as described in Example 5B. The removal of the unexposed and uncured areas of the plate was accomplished in a manner similar to Example 5B also. After (6) passes through the heated laminator rolls using fresh CEREX ™ non-woven web for each pass, a flexographic printing plate having a relief of 1.27 mm was produced. Half-tone dot definition was excellent as determined by visual inspection using a hand-held microscope of 10X magnifying power.

The novel radiation curable polyurethane elastomers used in the practice of the present invention may be described in a number of ways, in addition to the chemical characterizations given above. The elastomer contains two segments with different physical properties. There is the hard segment made up of the diisocyanate and short chain di-free hydrogen chain extenders. The remaining segment produced by the remaining reactants. It has been found that a broad preferred range of hard segments of the elastomer is from 25-60% of the total weight of the elastomer. A more preferred proportion for the hard segment is 30 to 50% by total weight of the elastomer. These ranges effectively include proportions of the individual components as follows:

A) 10-40% by weight of the at least one diisocyanate,
B) 0.5-20% by weight of said first di-free hydrogen containing chain extending agent containing at least one ethylenically unsaturated group per molecule (preferably as a pendant group) (preferably 0.75 to 12%),
C) 0.5-20% by weight of said second di-free-hydrogen containing chain extending group (which may be free of polymerizable ethylenic unsaturation) (preferably 0.75 to 12%), and
D) 10-60% by weight of said polyol.

Preferred elastomers of the present invention having the requisite physical properties described above (e.g., molecular weight, melt transition temperature, and melt index) would be composed of units derived from the following percentages of reactants (which would approximate the weight percentage of polymer units derived from those reactants):

A) 15 to 35% by weight of the diisocyanate,
B) 1 to 10% by weight of said first chain extending agent,
C) 1 to 15% by weight of said second chain extending agent, and
D) 20 to 60% by weight of said polyol.

I claim:

1. A process for producing a flexographic printing plate comprising providing a relief imageable element comprising a flexible substrate having on at least one surface thereof a radiation hardenable composition in a thickness of at least 0.3 mm, imagewise irradiating said composition to harden the composition in irradiated areas, contacting said imagewise irradiated layer with an absorbent layer which can absorb unirradiated composition when it has been heated between 40° and 200° C., heating said composition layer so that it is at a temperature between 40° and 200° C. while in contact with said absorbent layer, said temperature being sufficiently high to enable said composition in unirradiated areas to flow into said absorbent layer, allowing at least 75% of composition from unirradiated areas in contact with said absorbent layer to be absorbed by said absorbent layer, and removing said absorbent layer and said at least 75% of composition from unirradiated areas from said flexible substrate wherein after said absorbent layer is removed from said flexible substrate, the absorbent layer is heated to soften and remove at least some of said composition from said absorbent layer.

2. The process of claim 1 wherein said composition comprises a polymeric elastomer.

3. The process of claim 1 wherein gas or liquid flow is used in combination with heat to remove at least some of said composition from said absorbent layer.

4. The process of claim 3 wherein said composition comprises a polymeric elastomer.

5. A process for producing a flexographic printing plate comprising providing a relief imageable element comprising a flexible substrate having on at least one surface thereof a radiation hardenable composition in a thickness of at least 0.3 mm, imagewise irradiating said composition to harden the composition in irradiated areas, contacting said image irradiated layer with an absorbent layer which can absorb unirradiated composition when it has been heated between 40° and 200° C., heating said composition layer so that it is at a temperature between 40° and 200° C. while in contact with said absorbent layer, said temperature being sufficiently high to enable said composition in unirradiated areas to flow into said absorbent layer, allowing at least 75% of composition from unirradiated areas in contact with said absorbent layer to be absorbed by said absorbent layer, and removing said absorbent layer and said at least 75% of composition from unirradiated areas from said flexible substrate wherein said composition comprises an elastomer which displays less than 2% swell in deionized water at 20° C. for 24 hours, and further comprises from 0.3 to 10% by weight of a free radical photoinitiator, and wherein after said absorbent layer is removed from said flexible substrate, the absorbent layer is heated to soften and remove at least some of said composition from said absorbent layer.

6. The process of claim 2 wherein gas or liquid flow is used in combination with heat to remove at least some of said composition from said absorbent layer.

* * * * *

UNITED STATES PATENT AND TRADEMARK OFFICE
CERTIFICATE OF CORRECTION

PATENT NO. : 5,175,072

DATED : Dec. 29, 1992

INVENTOR(S) : Martens

It is certified that error appears in the above-identified patent and that said Letters Patent is hereby corrected as shown below:

| | |
|---|---|
| Col. 5, line 33 | "5%" should be --75%-- |
| Col. 7, line 55 | "-NH,," should be -- $-NH_2$,-- |
| Col. 9, line 2 | "equvalent" -- should be --equivalent-- |
| Col. 9, line 39 | "o include" should be --include-- |
| Col. 11, line 17 | "th curing" should be --the curing-- |
| Col. 12, line 52 | "porour sheet" should be --porous sheets-- |
| Col. 16, line 32 | "500-15,000" should be --1500-15,000-- |

UNITED STATES PATENT AND TRADEMARK OFFICE
CERTIFICATE OF CORRECTION

Page 2 of 2

PATENT NO. : 5,175,072
DATED : December 29, 1992
INVENTOR(S) : Martens

It is certified that error appears in the above-indentified patent and that said Letters Patent is hereby corrected as shown below:

Col. 27, line 25          "isocyanat" should be --isocyanate--

Col. 30,
Claim 1, line 25          "of composition from" should be
                          --of said composition in--

Col. 30,
Claim 5, lines 53-54      "of composition from" should be
                          --of said composition in--

Col 27, line 26,          "moisties" should be --moieties --.

Signed and Sealed this

Twenty-fourth Day of October, 1995

Attest:

BRUCE LEHMAN

Attesting Officer    Commissioner of Patents and Trademarks